United States Patent
JangJian et al.

(10) Patent No.: US 8,946,083 B2
(45) Date of Patent: Feb. 3, 2015

(54) IN-SITU FORMATION OF SILICON AND TANTALUM CONTAINING BARRIER

(75) Inventors: Shiu-Ko JangJian, Fengshan (TW); Ting-Chun Wang, Tainan (TW); Szu-An Wu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 197 days.

(21) Appl. No.: 13/167,857

(22) Filed: Jun. 24, 2011

(65) Prior Publication Data

US 2012/0326312 A1 Dec. 27, 2012

(51) Int. Cl.
  H01L 21/44 (2006.01)
  H01L 21/3105 (2006.01)
  H01L 21/768 (2006.01)
  H01L 23/48 (2006.01)

(52) U.S. Cl.
  CPC ...... *H01L 21/3105* (2013.01); *H01L 21/76898* (2013.01); *H01L 23/481* (2013.01); *H01L 21/76814* (2013.01); *H01L 21/76826* (2013.01); *H01L 21/76843* (2013.01); *H01L 21/76855* (2013.01); *H01L 2924/0002* (2013.01)
  USPC .......................................... 438/660; 257/751

(58) Field of Classification Search
  USPC .......... 257/734, 735, 741, 750, 751, E21.141, 257/E23.141, E23.142, 653, 652, 584, 655, 257/643, 627; 438/627, 653, 652, 584, 654, 438/655, 643
  See application file for complete search history.

(56) References Cited

U.S. PATENT DOCUMENTS

| | | | |
|---|---|---|---|
| 4,870,030 A | 9/1989 | Markunas et al. | |
| 6,143,645 A | 11/2000 | Hsu et al. | |
| 6,346,490 B1 | 2/2002 | Catabay et al. | |
| 6,436,825 B1 | 8/2002 | Shue | |
| 6,562,700 B1 | 5/2003 | Gu et al. | |
| 6,566,283 B1 | 5/2003 | Pangrle et al. | |
| 6,569,777 B1 | 5/2003 | Hsu et al. | |
| 6,770,977 B2 * | 8/2004 | Kishida et al. | 257/761 |
| 7,186,646 B2 * | 3/2007 | Lee | 438/653 |
| 8,026,605 B2 | 9/2011 | Dordi et al. | |
| 2004/0224504 A1 | 11/2004 | Gadgil | |
| 2007/0228571 A1 | 10/2007 | Yu et al. | |
| 2009/0308636 A1 * | 12/2009 | Chudzik et al. | 174/126.4 |
| 2010/0006909 A1 * | 1/2010 | Brady | 257/292 |
| 2010/0090342 A1 * | 4/2010 | Chang et al. | 257/751 |

FOREIGN PATENT DOCUMENTS

| | | |
|---|---|---|
| KR | 20050028665 A | 3/2005 |
| KR | 20090094369 A | 9/2009 |

* cited by examiner

*Primary Examiner* — Julio J Maldonado
*Assistant Examiner* — Robert Bachner
(74) *Attorney, Agent, or Firm* — Slater & Matsil, L.L.P.

(57) ABSTRACT

A method includes forming an opening in a dielectric layer, and forming a silicon rich layer on a surface of the dielectric layer. A portion of the silicon rich layer extends into the opening and contacts the dielectric layer. A tantalum-containing layer is formed over and the contacting the silicon rich layer. An annealing is performed to react the tantalum-containing layer with the silicon rich layer, so that a tantalum-and-silicon containing layer is formed.

20 Claims, 12 Drawing Sheets

IN-SITU FORMATION OF SILICON AND TANTALUM CONTAINING BARRIER

BACKGROUND

As the semiconductor industry introduces new generations of integrated circuits (IC's) having better performance and more functionality, the density of the circuit elements that form the integrated circuits is increased, and the dimensions, sizes, and spacing between the individual components or elements are reduced. While in the past such reductions were limited mainly by the ability to define the structures photolithographically, device geometries having smaller dimensions created new limiting factors. For example, for any two adjacent conductive paths, as the distance between the conductors decreases, the resulting capacitance (a function of the dielectric constant (k) of the insulating material divided by the distance between conductive paths) increases. The increased capacitance results in increased capacitive coupling between the conductors, increased power consumption, and an increase in the resistive-capacitive (RC) time constant. Therefore, continual improvement in semiconductor IC performance and functionality is dependent upon the using of low-k dielectric materials.

The using of low-k dielectric materials introduces the requirement of diffusion barriers, which have the function of preventing copper from diffusing into the low-k dielectric layers. Tantalum nitride (TaN) has a good diffusion-retarding ability, and was commonly used to form barrier layers. The resistivity of TaN, however, is about one order higher than that of tantalum (Ta). Accordingly, Ta on TaN (or titanium (Ti) on titanium nitride TiN)) was typically used to form barrier layers. TaN/Ta and TiN/Ti barrier layers suffer from drawbacks. The metallic Ta and Ti do not bond well to the non-metallic silicon or silicon oxide substrate, and TaN and TiN do not bond well with copper. As a result, delamination, peeling, and void may occur during the chemical mechanical polish step, which is used for forming copper interconnect structures that are located on the TaN/Ta or TiN/Ti barrier layers.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

The making and using of the embodiments of the disclosure are discussed in detail below. It should be appreciated, however, that the embodiments provide many applicable inventive concepts that can be embodied in a wide variety of specific contexts. The specific embodiments discussed are merely illustrative, and do not limit the scope of the disclosure.

A barrier layer having good bonding ability with dielectric materials and copper, and the method of forming the same are provided in accordance with an embodiment. The intermediate stages of manufacturing various embodiments are illustrated. The variations of the embodiment are then discussed. Throughout the various views and illustrative embodiments, like reference numbers are used to designate like elements.

Figure 1:
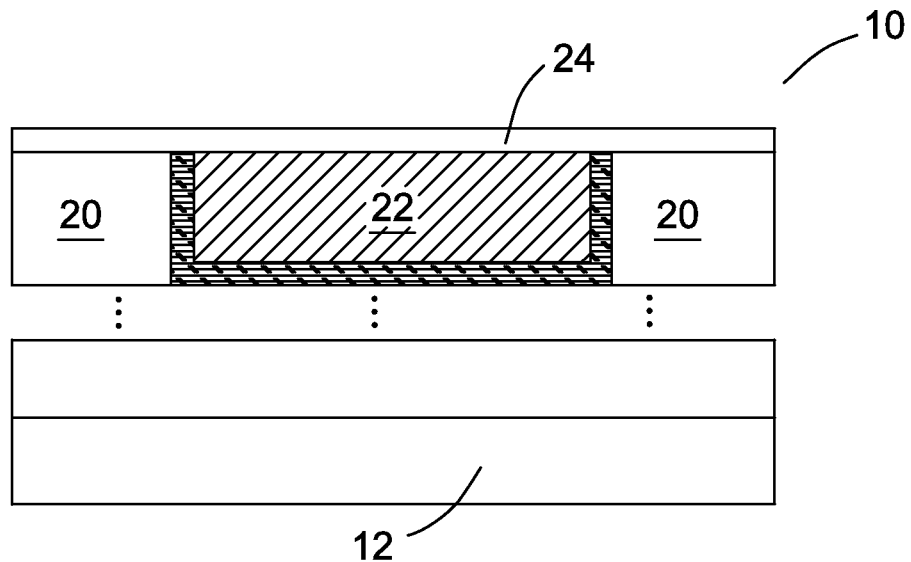
FIGS. 1 through 7 are cross-sectional views of intermediate stages in the manufacturing of an interconnect structure in accordance with an embodiment, wherein the interconnect structure comprises a tantalum-and-silicon containing layer formed on a low-k dielectric layer.

FIG. 1 illustrates a portion of wafer 10, which includes substrate 12. Substrate 12 may be a semiconductor substrate such as a silicon substrate. Semiconductor devices such as transistors (not shown) may be formed at the surface of substrate 12. Dielectric layer 20 and conductive feature 22 are formed over substrate 12. Conductive line 22 may be a metal feature comprising copper, tungsten, aluminum, silver, gold, alloys thereof, compounds thereof, and combinations thereof. Dielectric layer 20 may be an inter-layer dielectric (ILD) layer or an inter-metal dielectric (IMD) layer, and may have a low k value, which may be lower than about 2.5, for example. Etch stop layer (ESL) 24 is formed over dielectric layer 20 and conductive feature 22. ESL 24 may comprise nitrides, silicon-carbon based materials, carbon-doped oxides, and combinations thereof.

Figure 2:
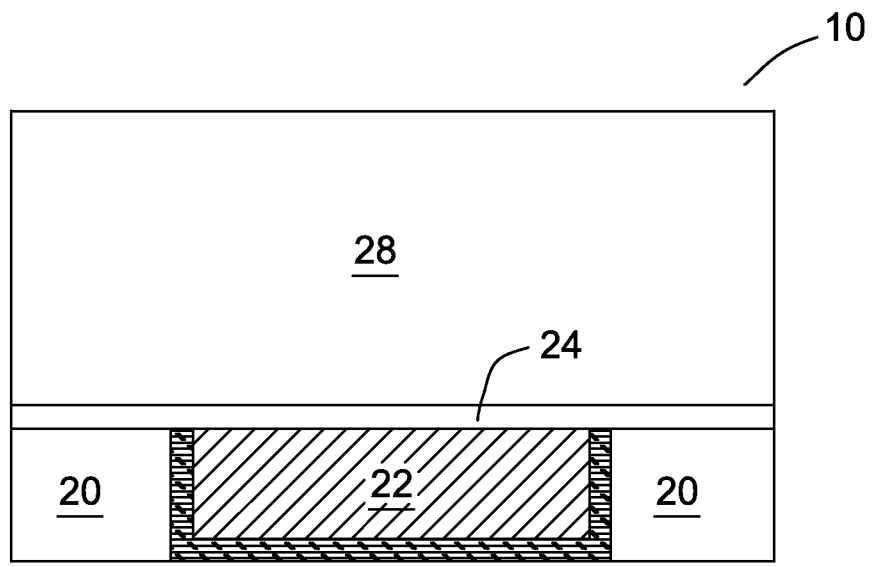

FIG. 2 illustrates the formation of low-k dielectric layer 28, which provides the insulation between conductive line 22 and overlying conductive lines that will be formed subsequently. Accordingly, low-k dielectric layer 28 is sometimes referred to as an inter-metal dielectric (IMD) layer. Low-k dielectric layer 28 may have a dielectric constant (k value) lower than about 3.5, or lower than about 2.5. The materials of low-k dielectric layer 28 may include carbon-containing materials and/or fluorine-containing materials, for example. Low-k dielectric layer 28 may be deposited using a chemical vapor deposition (CVD) method such as plasma enhanced CVD (PECVD), low pressure CVD (LPCVD), and atomic CVD (ALCVD), although other commonly used deposition methods such as and spin-on can also be used. ESL 25 may be optionally formed.

Figure 3:
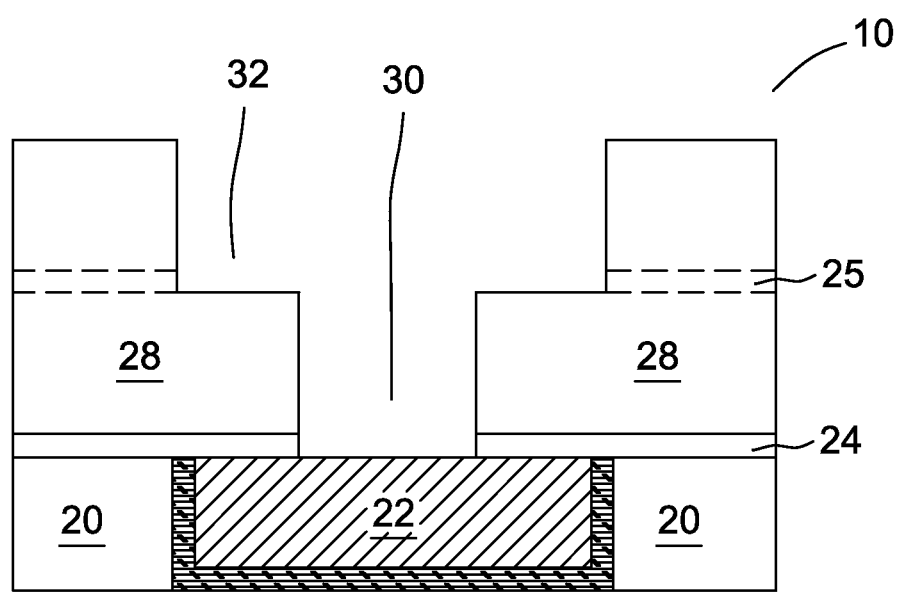

FIG. 3 illustrates the formation of via opening 30 and a trench opening 32 in low-k dielectric layer 28. Photo resists (not shown) are formed and patterned over low-k dielectric layer 28 to aid the formation of via opening 30 and trench opening 32. In an embodiment, an anisotropic etch us used to etch through low-k dielectric layer 28 and stops at ESL 24, thereby forming via opening 30. Trench opening 32 is then formed. In alternative embodiments, a trench-first approach is taken, in which trench opening 32 is formed prior to the formation of via opening 30. ESL 24 is then etched through via opening 30, exposing underlying conductive feature 22.

Figure 4:
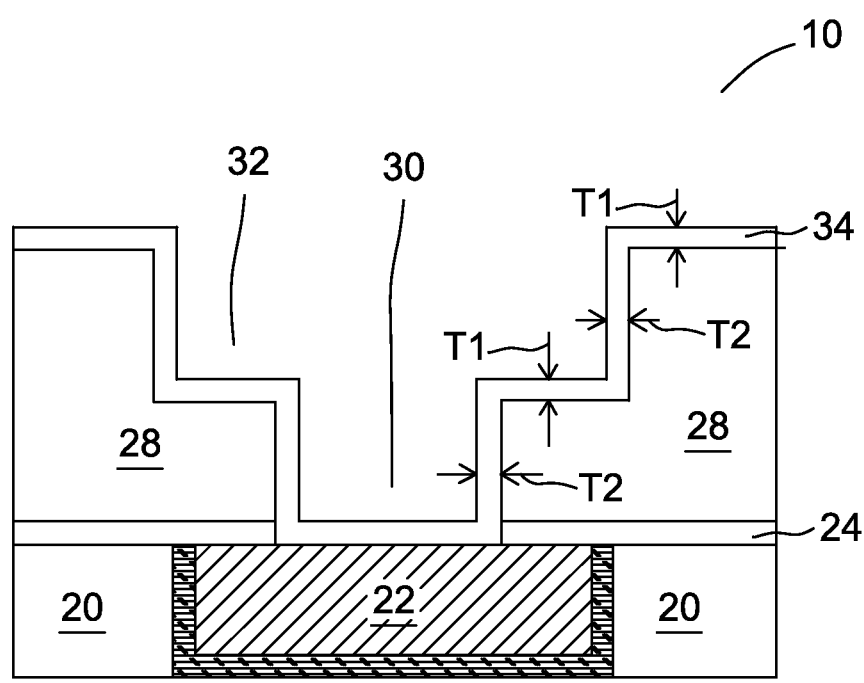

Referring to FIG. 4, silicon rich layer 34 is formed at, and in physical contact with, the exposed surfaces of low-k dielectric layer 28. Silicon rich layer 34 has a higher silicon concentration than low-k dielectric layer 28. In an embodiment, the formation process comprises a treatment of the exposed surfaces of low-k dielectric layer 28, so that additional silicon atoms are added into, and over, the surface layer of low-k dielectric layer 28. A layer of silicon may also be deposited at the bottom of via opening 30 and in contact with metal feature 22. The surface layer of low-k dielectric layer 28 is converted to silicon rich layer 34. The treatment may be performed using a chemical vapor deposition (CVD) process such as plasma-enhanced CVD. The precursor of the treatment include silicon-containing gases, which may be silane-based gases such silane, methyl-silane (1MS), di-methyl-silane (2MS), tri-methyl-silane (3MS), and combinations thereof. In addition, carrier gases that do not react with the precursors may be added, wherein the carrier gases may include inert gases such as helium, argon, and the like. The precursor gases may, or may not, include other gases that react with the silicon-containing gases. As a result of the treatment, the added silicon atoms bond with the atoms in dielectric layer 28 to form silicon rich layer 34. The portions of silicon rich layer 34 that are on the exposed surfaces of low-k dielectric layer 28 (but not including the portion on metal feature 22) may be a substantially conformal layer, wherein thickness T1 of the lateral portions and thicknesses T2 of the vertical portions are close to each other, for example, with a difference less than about 20 percent (or less than about 10 percent) thicknesses T1 and T2. Thicknesses T1 and T2 may be less than about 20 Å in some embodiments.

Figure 5:
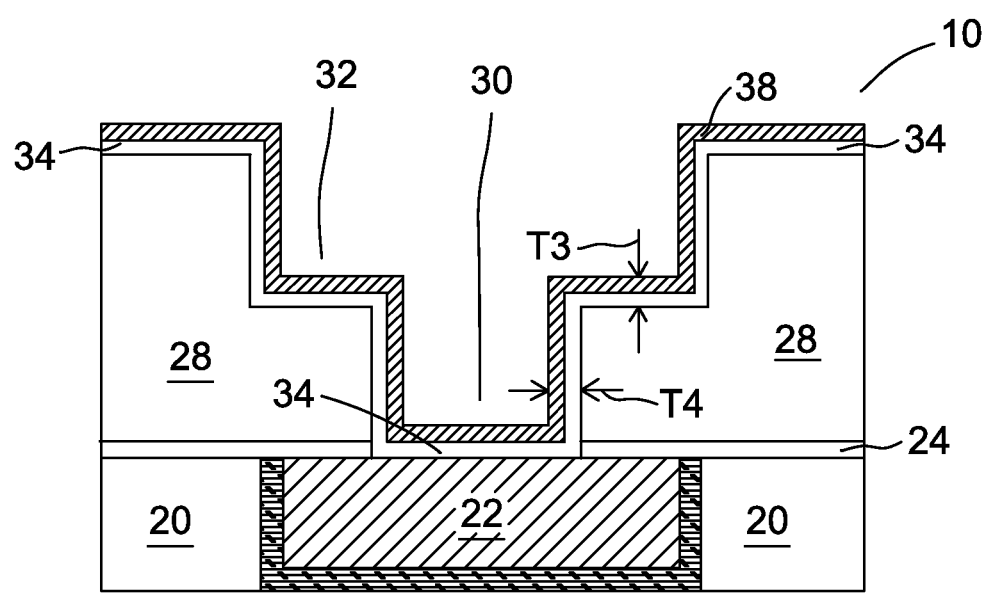
Figure 11:
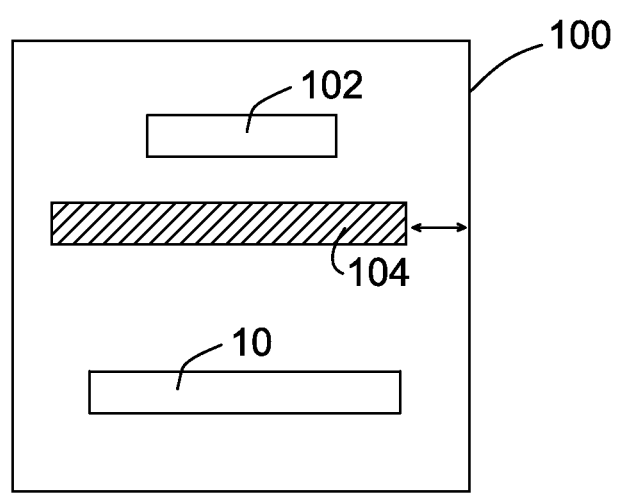
FIG. 11 illustrates a schematic cross-sectional view of a chamber for performing the in-situ formation of a silicon rich layer, a tantalum-containing layer, and a tantalum-and-silicon containing layer in accordance with embodiments.

Next, as shown in FIG. 5, tantalum-containing layer 38 is formed over and contacting silicon rich layer 34. Tantalum-containing layer 38 may be a tantalum nitride (TaN) layer, or a tantalum (Ta) layer that is substantially free from nitrogen. In the embodiments wherein tantalum-containing layer 38 comprises TaN, the process gas may include a nitrogen-containing gas such as ammonia. The process for forming tantalum-containing layer 38 may include physical vapor deposition (PVD). Thickness T3 and T4, which are the horizontal thickness and vertical thickness, respectively, of tantalum-containing layer 38 may be greater than about 20 Å. Both the formation of silicon rich layer 34 and the formation of tantalum-containing layer 38 may be performed in a same vacuum environment. There is no vacuum break between, and during, the step of forming silicon rich layer 34 and the step of forming tantalum-containing layer 38. In an embodiment, silicon rich layer 34 and tantalum-containing layer 38 are formed in a same process chamber. For example, FIG. 11 schematically illustrates exemplary process chamber 100, which includes tantalum target 102 and wafer 10. In an exemplary setting, when silicon rich layer 34 is formed, shielding plate 104 is moved into the path between target 102 and wafer 10, so that no Ta atoms are sputtered from Ta target 102 and deposited on wafer 10. When tantalum-containing layer 38 is formed, shielding plate 104 is moved away from the path, so that Ta atoms may be sputtered from Ta target 102 and deposited on wafer 10. Accordingly, the same chamber 100 may be used to perform the in-situ formation of silicon rich layer 34 and tantalum-containing layer 38.

In alternative embodiments, silicon rich layer 34 and tantalum-containing layer 38 are formed in different chambers (not shown) that are in the same vacuum environment. Accordingly, when wafer 10 is transported from a first chamber for forming silicon rich layer 34 to a second chamber for forming tantalum-containing layer 38, no vacuum break occurs.

Figure 6:
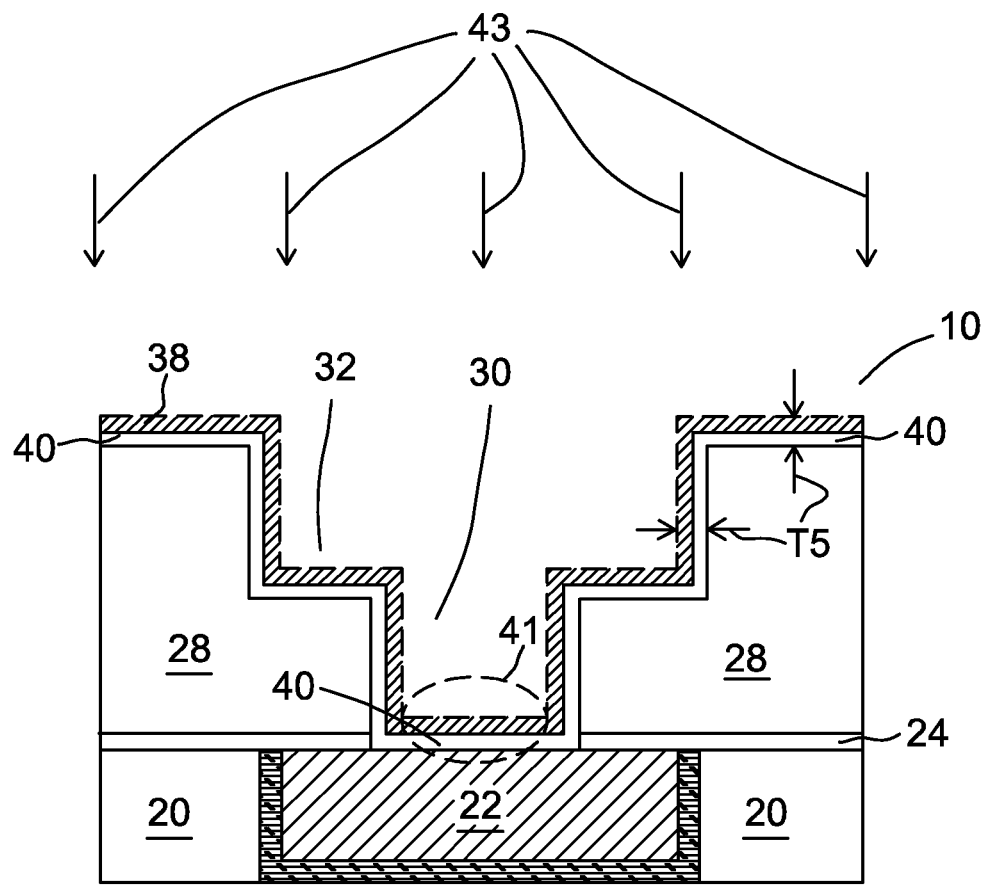

FIG. 6 illustrates the in-situ annealing process to form tantalum-and-silicon containing layer 40. In an embodiment, no vacuum break occurs between, and during, the step of forming tantalum-containing layer 38 and the annealing. The annealing may be performed at a temperature between about 100° and about 400° C. The desirable annealing time depends on the annealing temperature, and with higher annealing temperatures, the annealing time may be reduced. Exemplary annealing time may be between about 10 seconds and 2 minutes. After the annealing, silicon rich layer 34 fully reacts with tantalum-containing layer 38 to form tantalum-and-silicon containing layer 40. In the embodiments wherein tantalum-containing layer 38 is a tantalum layer, the resulting tantalum-and-silicon containing layer 40 is a tantalum silicide layer. In the embodiments wherein tantalum-containing layer 38 is a tantalum nitride layer, the resulting tantalum-and-silicon containing layer 40 is a tantalum silicon nitride layer. There may, or may not, exist remaining tantalum-containing layer 38 after the annealing. The remaining tantalum-containing layer 38 (illustrated using dashed lines), if any, will be directly over and contacting tantalum-and-silicon containing layer 40. Thicknesses T5 of tantalum-and-silicon containing layer 40 may be less than about 35 Å, and may be between about 5 Å and about 30 Å. Tantalum-and-silicon containing layer 40 may be a layer that is clearly visible under scanning electron microscope (SEM) as being distinguished from low-k dielectric layer 28 and the subsequently formed via 42 and metal line 44 (not shown in FIG. 6, please refer to FIG. 7).

When tantalum-and-silicon containing layer 40 comprises tantalum silicon nitride, since tantalum silicon nitride has a high resistivity, the portion of tantalum-and-silicon containing layer 40 located at the bottom of via opening 30 is removed to form a bottom opening. The removed portion of tantalum-and-silicon containing layer 40 is marked using dashed line 41. The bottom opening may be performed using plasma (marked as arrows 43). As a result, there is no tantalum-and-silicon containing layer 40 at the bottom of via opening 30, while tantalum-and-silicon containing layer 40 remains at the bottom of trench opening 32 and the sidewalls of low-k dielectric layer 28.

Figure 7:
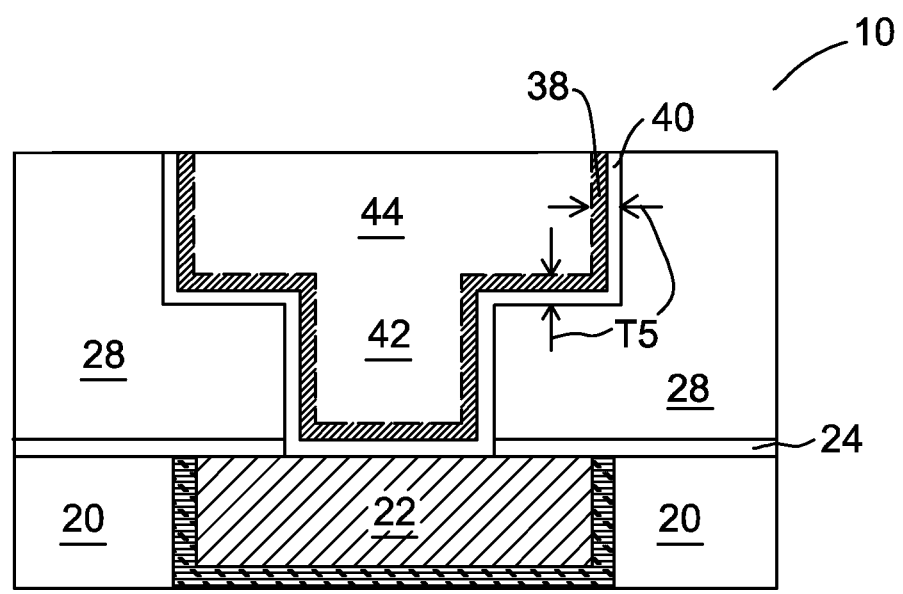

Referring to FIG. 7, via opening 30 and trench opening 32 are filled with a metallic material, which may be copper or a copper alloy. Other metals and metal alloys such as aluminum, tungsten, silver, and gold can also be used. A chemical mechanical polish (CMP) is then performed to remove excess portions of the tantalum-containing layer 38, the metallic material, and tantalum-and-silicon containing layer 40 that are over the top surface of low-k dielectric layer 28. As a result, via 42 and metal line 44 are formed. In the resulting structure, via 42 and metal line 44 may be in physical contact with tantalum-and-silicon containing layer 40 if no tantalum-containing layer 38 remains, or in physical contact with remaining tantalum-containing layer 38.

Figure 8:
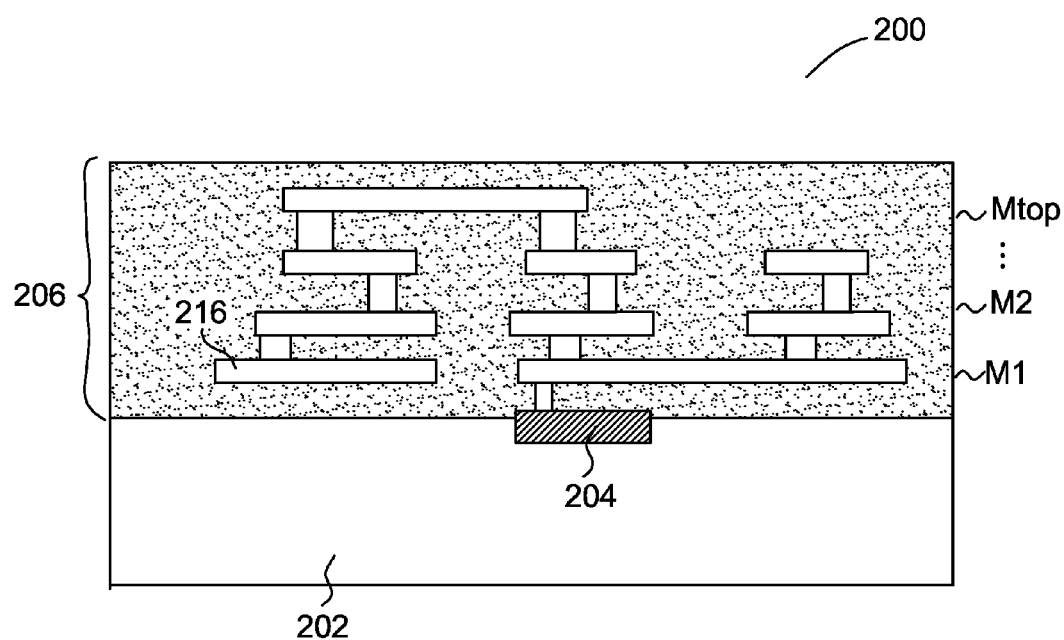
FIGS. 8 through 10B are cross-sectional views of intermediate stages in the manufacturing of metal connections in accordance with various alternative embodiments, wherein the metal connections penetrate through a semiconductor substrate, on which an image sensor is formed.

The previously discussed embodiment illustrates the formation of a dual damascene structure. Tantalum-and-silicon containing layer 40 can also be formed in single damascene structures. In addition, tantalum-and-silicon containing layer 40 may be formed as barrier layers in other devices. For example, FIGS. 8 through 10 illustrate the intermediate stages in the formation of tantalum-and-silicon containing layer 40 in an image sensor chip, which may comprise complementary metal-oxide-semiconductor (CMOS) image sensors or photo diodes. Referring to FIG. 8, image sensor chip 200, which may be a portion of an image sensor wafer, is illustrated. Image sensor chip 200 includes semiconductor substrate (which may be a silicon substrate) 202. Image sensor 204, which may be a photo-sensitive MOS transistor or a photo-sensitive diode, is formed at the surface of silicon substrate 202. Interconnect structure 206 is formed over silicon substrate 202, and is used to interconnect the devices in image sensor chip 200. Interconnect structure 206 includes metals and vias in dielectric layers. Interconnect structure 206 includes a plurality of metal layers, which may be formed of copper or a copper alloy. For example, FIG. 8 schematically illustrates metal layers M1 (a bottom metal layer), M2 . . . and Mtop, wherein metal layer Mtop is the top metal layer of interconnect structure 206. Image sensor 204 may be electrically connected to metal feature 216, which may be in any of metal layers M1 through Mtop. The electrical connection between image sensor 204 and metal feature 216 may be made through any of the metal layers M1 through Mtop. For example, in the illustrated embodiment in FIG. 8, the electrical connection between image sensor 204 and metal feature 216 is made through a metal feature in each of metal layers M1 through Mtop.

Figure 9A:
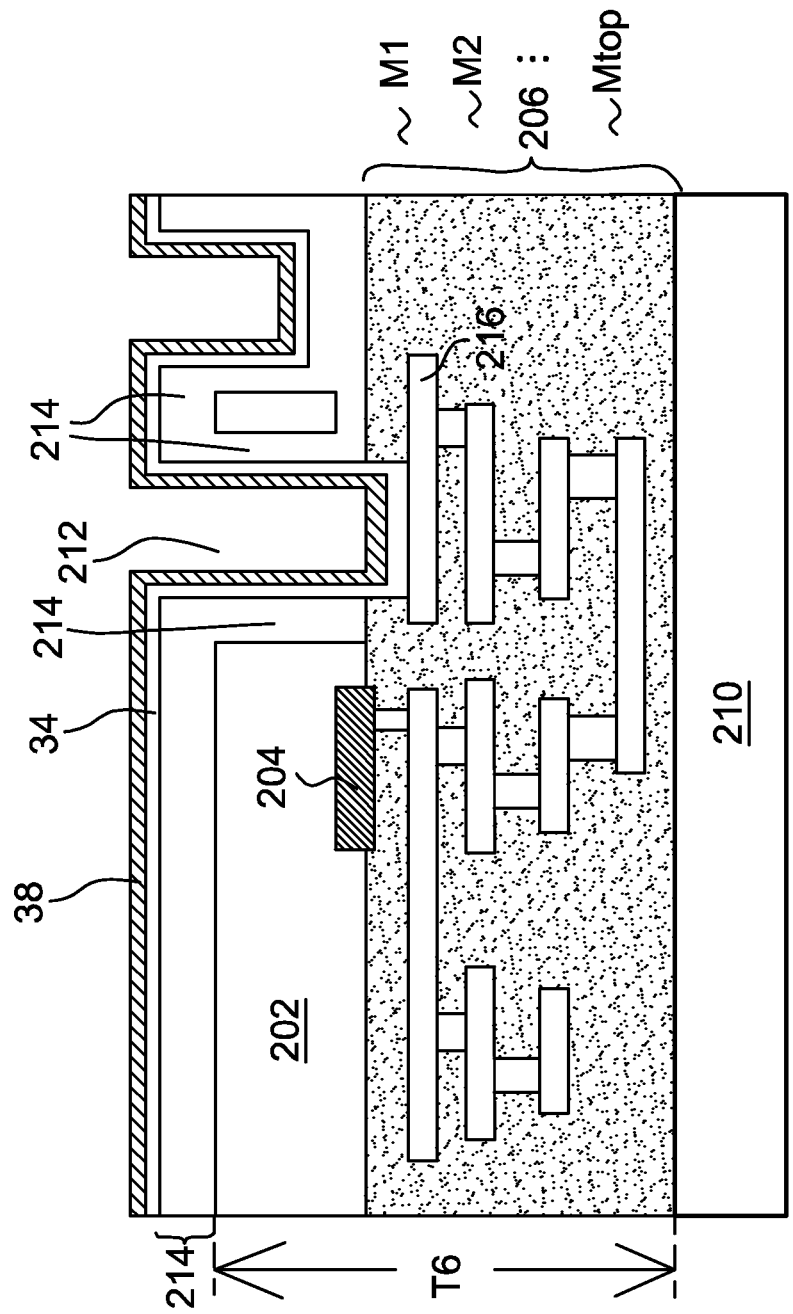
Figure 9B:
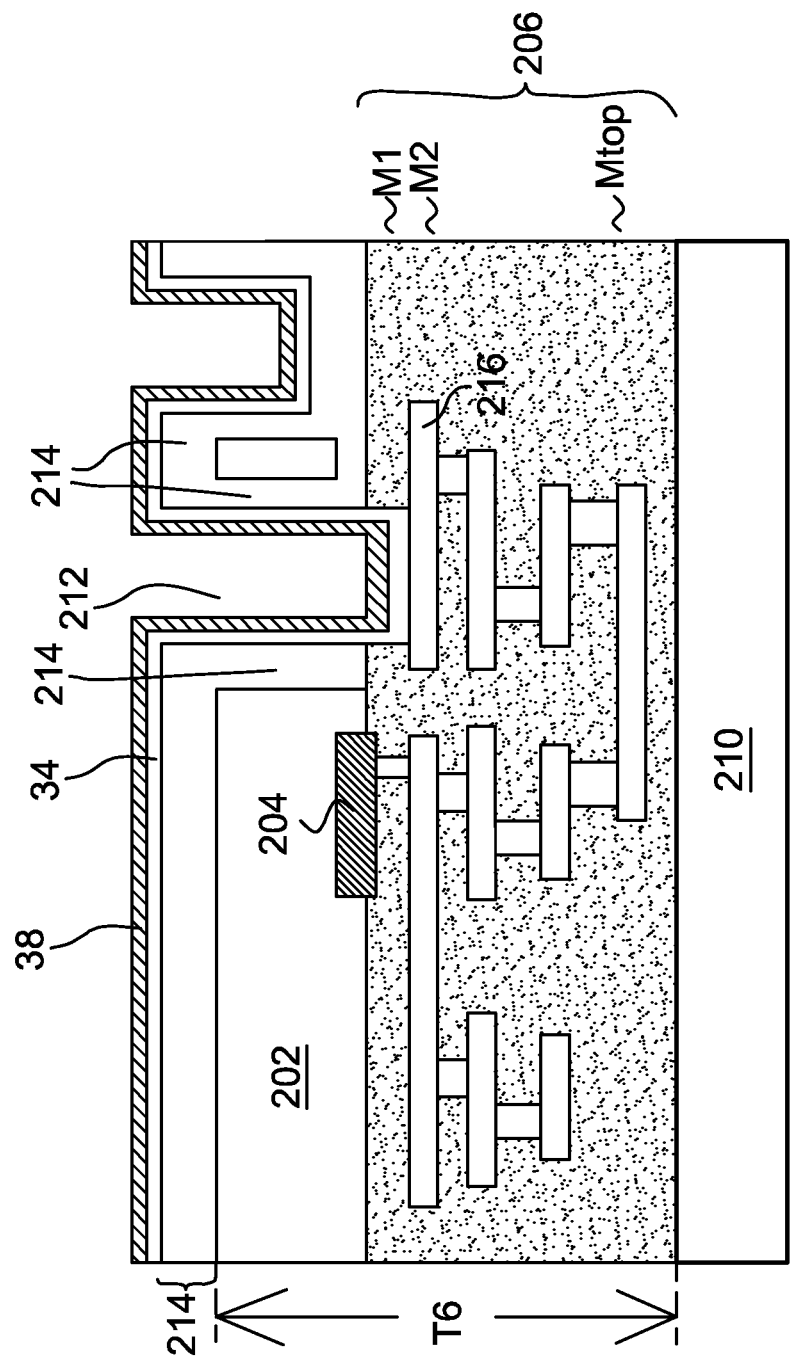

Referring to FIGS. 9A and 9B, image sensor chip 200 is flipped, and is attached to carrier 210, with silicon substrate 20 facing up. A mechanical thinning is performed to thin silicon substrate 202, until thickness T6 of sensor chip 200 is smaller than about 20 µm. At this thickness, light can penetrate through the remaining silicon substrate 202, and reaches image sensor 204. Silicon substrate 202 is then etched to form openings 212. Opening 212 may be a through-substrate opening that penetrates through silicon substrate 202. Furthermore, opening 212 may extend into the dielectric layers in interconnect structure 206, so that metal feature 216 is exposed. Metal feature 216 may be a metal line or a metal pad, and may be electrically connected to image sensor 204. In an embodiment, as shown in FIG. 9A, metal feature 216 is in the bottom metal layer M1. In alternative embodiments, as shown in FIG. 9B, metal feature 216 may be in any of metal layers that are over metal layer M1, including metal layers M2 through Mtop.

Figure 10A:
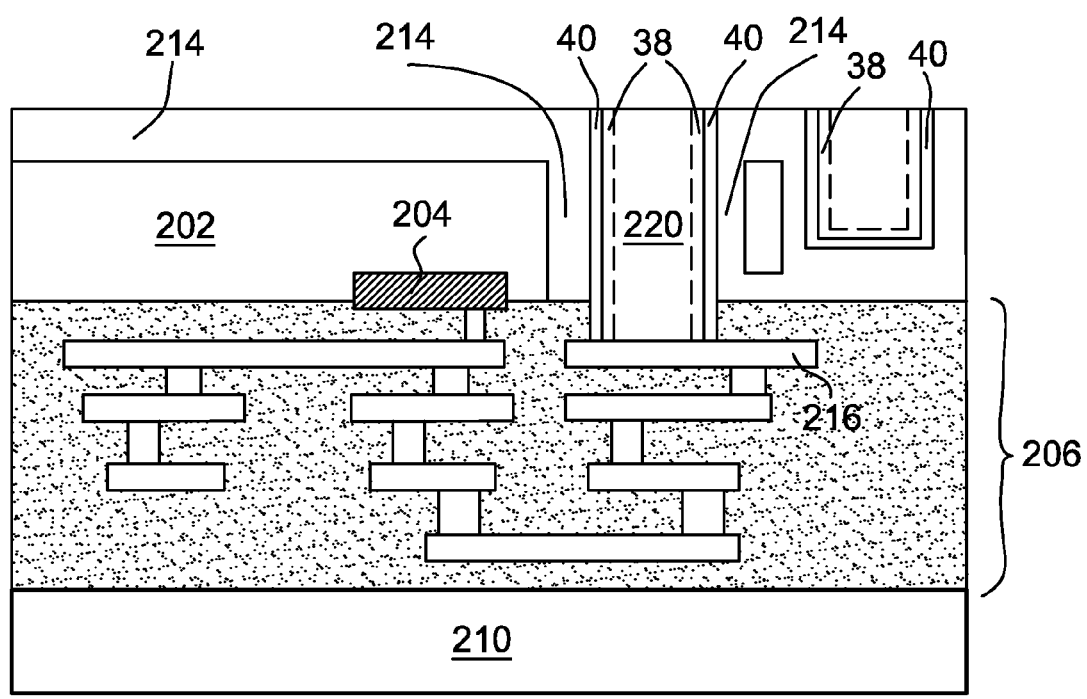
Figure 10B:
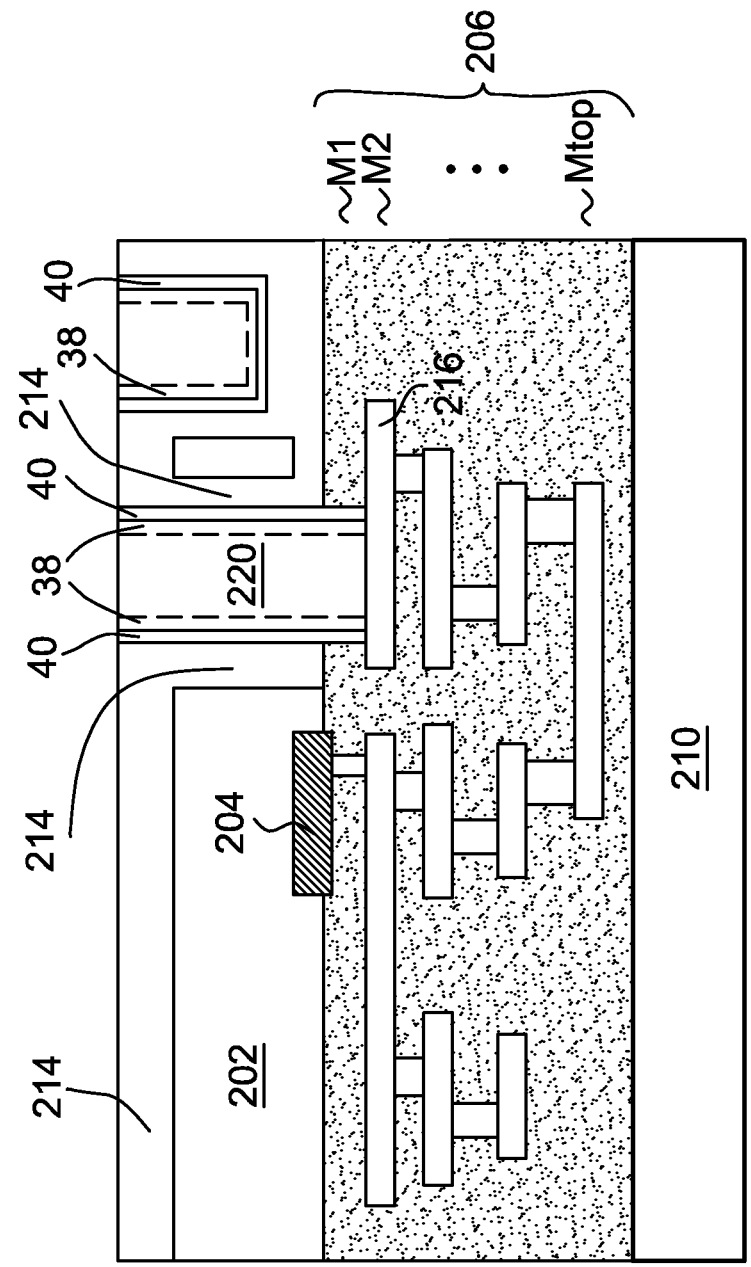

Dielectric layer(s) 214 is then formed on the remaining silicon substrate 202, and extend into opening 212. The dielectric material at the bottom of opening 212 is removed, so that metal feature 216 is exposed to opening 212. Next, silicon rich layer 34 and tantalum-containing layer 38 are formed. Referring to FIGS. 10A and 10B, an annealing is performed to cause a reaction between silicon rich layer 34 and tantalum-containing layer 38, so that tantalum-and-silicon containing layer 40 is formed. The formation processes may be essentially the same as in the embodiments in FIGS. 4 through 7. The bottom portion of tantalum-and-silicon containing layer 40 may then be removed, and metal 220 is filled into opening 212. Metal 220 thus acts as a through-substrate via (TSV) that is electrically connected to image sensor 204. In an embodiment, metal 220 is formed of conductive material such as copper or a copper alloy. Depending on the metal layer of metal feature 216, metal 220 may extend to, and contact, the metal lines or metal pads in any of metal layers M1 through Mtop. Metal 220 is encircled by tantalum-and-silicon containing layer 40, and possibly by tantalum-containing layer 38. Furthermore, tantalum-and-silicon containing layer 40 and optionally tantalum-containing layer 38 have bottom ends contacting metal feature 216.

Due to the formation of tantalum-and-silicon containing layer 40, the mechanical and electrical properties of interconnect structures are improved. Tantalum-and-silicon containing layer 40 has better adhesion to low-k dielectric layer 28 (and some other dielectric materials), tantalum, and copper, and thus delamination in the interconnect structures is reduced. Tantalum-and-silicon containing layer 40 has an amorphous structure, and is an effective barrier for preventing copper from penetrating through tantalum-and-silicon containing layer 40. In addition, tantalum-and-silicon containing layer 40 causes a lower stress than tantalum and tantalum nitride do, and hence is beneficial for the thin image sensor chips that are prone to the warpage caused by the stresses.

In accordance with embodiments, a method includes forming an opening in a dielectric layer, and forming a silicon rich layer on a surface of the dielectric layer. A portion of the silicon rich layer extends into the opening and contacts the dielectric layer. A tantalum-containing layer is formed over and the contacting the silicon rich layer. An annealing is performed to react the tantalum-containing layer with the silicon rich layer, so that a tantalum-and-silicon containing layer is formed.

In accordance with other embodiments, a method includes performing a treatment to an exposed surface of a dielectric layer that has an opening using a silicon-containing precursor, wherein the treatment converts a surface layer of the dielectric layer into a silicon rich layer. A portion of the silicon rich layer extends on sidewalls of the dielectric layer in the opening. A tantalum-containing layer is formed over and contacting the silicon rich layer. The tantalum-containing layer contacts sidewall portions of the silicon rich layer in the opening. An annealing is performed to react the tantalum-containing layer with the silicon rich layer to form a tantalum-and-silicon containing layer. The steps of performing the treatment, forming the tantalum-containing layer, and the annealing are performed in a same vacuum environment, with no vacuum break occurring therebetween. After the step of annealing, a portion of the tantalum-and-silicon containing layer is removed from a bottom of the opening. A metallic material is then filled into the opening.

In accordance with yet other embodiments, a method includes forming a low-k dielectric layer over a substrate, forming an opening in the low-k dielectric layer, and treating surfaces of the low-k dielectric layer using a silane-containing precursor. As a result, a silicon rich layer is formed on the surfaces of the low-k dielectric layer. A tantalum nitride layer is formed over and the contacting the silicon rich layer, wherein the tantalum nitride layer extends into the opening. An annealing is performed to react the tantalum nitride layer with the silicon rich layer, so that a tantalum silicon nitride layer is formed. The steps of treating, forming the tantalum nitride layer, and the annealing are in-situ performed with no vacuum break therebetween. After the step of annealing, a portion of the tantalum silicon nitride layer is removed from a bottom of the opening. A metallic material is then into the opening.

In accordance with yet other embodiments, a device includes a semiconductor substrate, and an interconnect structure including a plurality of metal layers, wherein the interconnect structure is on a first side of the semiconductor substrate. An opening extends from a second side of the semiconductor substrate to expose one of the metal layers. A dielectric layer is disposed in the opening, wherein the one of the metal layers is exposed through the opening in the dielectric layer. A tantalum silicon nitride layer is formed on the dielectric layer.

Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addi-

What is claimed is:

1. A method comprising:
   forming an opening in a dielectric layer;
   forming a silicon rich layer in the opening and contacting the dielectric layer;
   forming a tantalum-containing layer over and contacting the silicon rich layer;
   performing an annealing to react the tantalum-containing layer with the silicon rich layer to form a tantalum-and-silicon containing layer;
   after the annealing, filling the opening with a copper-containing metallic material, wherein at least two of steps among the forming the silicon rich layer, the forming the tantalum-containing layer, and the annealing are performed in a same vacuum environment, with no vacuum break occurring between the at least two of steps; and
   after the annealing, removing a portion of the tantalum-and-silicon containing layer from a bottom of the opening.

2. The method of claim 1, wherein the at least two of steps comprise the forming the silicon rich layer and the forming the tantalum-containing layer.

3. The method of claim 1, wherein the at least two of steps comprise the forming the tantalum-containing layer.

4. The method of claim 1, wherein after the step of performing the annealing, an entirety of the silicon rich layer is reacted with the tantalum-containing layer.

5. The method of claim 1, wherein the tantalum-containing layer is substantially free from nitrogen.

6. The method of claim 1, wherein the tantalum-containing layer comprises tantalum nitride.

7. A method comprising:
   forming an opening having a sidewall in a dielectric layer;
   performing a treatment using a silicon-containing precursor to form a silicon rich layer on the sidewall of the opening;
   forming a tantalum-containing layer over and contacting the silicon rich layer;
   performing an annealing to react the tantalum-containing layer with the silicon rich layer to form a tantalum-and-silicon containing layer, wherein the steps of performing the treatment, forming the tantalum-containing layer, and the annealing are performed in a same vacuum environment, with no vacuum break occurring therebetween;
   after the step of annealing, removing a portion of the tantalum-and-silicon containing layer from a bottom of the opening; and
   filling a metallic material into the opening, wherein the metallic material comprises copper, and is filled after the annealing.

8. The method of claim 7, wherein a silane-based precursor is used in the step of performing the treatment.

9. The method of claim 7 further comprising:
   before the step of performing the treatment, forming the dielectric layer over a semiconductor substrate, wherein the dielectric layer comprises a low-k dielectric material; and
   forming the opening in the dielectric layer, wherein the sidewalls of the low-k dielectric material are exposed to the opening.

10. The method of claim 7 further comprising:
    before the step of performing the treatment, performing a thinning process to a backside of a semiconductor substrate;
    forming an additional opening penetrating through the semiconductor substrate; and
    forming the dielectric layer in the additional opening in the semiconductor substrate.

11. The method of claim 7, wherein the tantalum-containing layer is substantially free from nitrogen.

12. The method of claim 7, wherein the tantalum-containing layer is a tantalum nitride layer.

13. A method comprising:
    forming a low-k dielectric layer over a substrate;
    forming an opening having sidewalls in the low-k dielectric layer;
    forming a silicon rich layer on the sidewalls of the opening by treating the low-k dielectric layer with a silane containing precursor;
    forming a tantalum nitride layer over and contacting the silicon rich layer;
    performing an annealing to react the tantalum nitride layer with the silicon rich layer, so that a tantalum silicon nitride layer is formed, wherein the steps of treating, forming the tantalum nitride layer, and the annealing are in-situ performed with no vacuum break therebetween;
    after the step of annealing, removing a portion of the tantalum silicon nitride layer from a bottom of the opening; and
    after the step of annealing, filling a metallic material into the opening, wherein the metallic material comprises copper.

14. The method of claim 13, wherein the tantalum silicon nitride layer has a thickness between about 5 Å and about 30 Å.

15. The method of claim 13, wherein during the step of annealing, the tantalum nitride layer is fully reacted.

16. The method of claim 13, wherein during the step of annealing, a bottom portion of the tantalum nitride layer is reacted, and a top portion of the tantalum nitride layer is not reacted, and is in contact with the metallic material after the metallic material is filled.

17. The method of claim 13, wherein the steps of treating, forming the tantalum nitride layer, and the annealing are performed in a chamber comprising a tantalum-containing target therein, and wherein the method further comprises:
    during the step of treating the low-k dielectric layer, moving a shielding plate into a path between the tantalum-containing target and the substrate; and
    during the step of forming the tantalum nitride layer, moving the shielding plate away from the path.

18. The method of claim 7, wherein after the annealing, an entirety of the silicon rich layer is reacted with the tantalum-containing layer.

19. The method of claim 13, wherein after the annealing, an entirety of the silicon rich layer is reacted with the tantalum nitride layer.

20. The method of claim 1, wherein after the annealing, an entirety of the silicon rich layer is reacted with the tantalum-containing layer.

* * * * *